United States Patent
Shenoy (10) Patent No.: US 6,465,311 B2
(45) Date of Patent: Oct. 15, 2002

(54) METHOD OF MAKING A MOSFET STRUCTURE HAVING IMPROVED SOURCE/DRAIN JUNCTION PERFORMANCE

(75) Inventor: Jayarama N. Shenoy, Santa Clara, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/836,936

(22) Filed: Apr. 17, 2001

(65) Prior Publication Data

US 2001/0031536 A1 Oct. 18, 2001

Related U.S. Application Data

(62) Division of application No. 09/144,963, filed on Sep. 1, 1998, now Pat. No. 6,239,472.

(51) Int. Cl.[7] .............................................. H01L 21/336
(52) U.S. Cl. ..................... 438/300; 438/301; 438/303; 438/305
(58) Field of Search ................................ 438/300, 299, 438/301, 303, 305–307

(56) References Cited

U.S. PATENT DOCUMENTS

| | | |
|---|---|---|
| 5,164,805 A | 11/1992 | Lee |
| 5,455,448 A | 10/1995 | Benjamin |
| 5,627,097 A | 5/1997 | Venkatesan et al. |
| 5,665,624 A * | 9/1997 | Hong .......................... 438/244 |
| 5,905,285 A | 5/1999 | Gardner et al. |
| 6,071,783 A * | 6/2000 | Liang et al. ................. 438/264 |

OTHER PUBLICATIONS

P. Bricout and E. Dubois, "*Short–Channel Effect Immunity and Current Capability of Sub–0.1 Micron MOSFET's Using a Recessed Channel*", 11–24–95, IEEE Transactions on Electron Devices, vol. 43, No. 8, 8–96.

J. Lyu, B. Park, K. Chun and J. Lee, "*Reduction of Hot–Carrier Generation in 0.1–μm Recessed Channel nMOSFET with Laterally Graded Doping Profile*", 1–18–97, IEEE Electron Device Letters, vol. 18, No. 11, 11–97.

J. Sun, R. Bartholomew, K. Bellur, A. Srivastava, C. Osburn, and N. Masnari, "*The Effect of the Elevated Source/Drain Doping Profile on Performance and Reliability of Deep Submicron MOSFET*" 1–7–97, IEEE Transactions on Electron Devices , vol. 44, No. 9, 9–97.

J. Pfiester, R. Sivan, H. Liaw, C. Seelbach and C. Gunderson, "*A Self–Aligned Elevated Source/Drain MOSFET*" , 5–7–90, IEEE Electron Device Letters, vol. 11, No. 9, 9–90.

* cited by examiner

Primary Examiner—Tuan H. Nguyen
Assistant Examiner—Thanh Nguyen
(74) Attorney, Agent, or Firm—Peter Zawilski (57) ABSTRACT

A MOSFET structure having substantially reduced parasitic junction capacitance, relaxed thermal budget constraints and resiliency to hot carrier damage is disclosed. The MOSFET structure includes a gate stack that is disposed over a gate oxide that is in turn disposed over an active region of a substrate. A pair of shallow trenches are defined on either side of the gate stack, and an intrinsic silicon material is disposed within the pair of shallow trenches up to a top surface of the gate stack. The MOSFET structure further includes source and drain implanted impurities that are defined in an upper portion of the intrinsic silicon material. The upper portion is configured to extend down into the intrinsic silicon material to a target diffusion level that is just below the gate oxide of the gate stack.

11 Claims, 9 Drawing Sheets

METHOD OF MAKING A MOSFET STRUCTURE HAVING IMPROVED SOURCE/DRAIN JUNCTION PERFORMANCE

This is a Divisional application of prior application Ser. No. 09/144,963 filed on Sep. 1, 1998, now U.S. Pat. No. 6,239,472.

BACKGROUND OF THE INVENTION

1. Field of the Invention

The present invention relates generally to integrated circuits and, more particularly, to semiconductor transistor structures having improved source/drain junction performance.

2. Description of the Related Art

As the demand for faster, smaller, and more densely packed integrated circuit designs continue to increase, a greater burden is placed on design engineers to improve upon the design of standard CMOS transistors. Dominant limitations in scaling down the size of transistors are directly linked to increasing parasitic source/drain junction capacitances, tight thermal budget constraints for backend processing, hot carrier damage, and the possibility of punch-through between the source/drain as gate lengths continue to shrink. These limitations are therefore the driving force that has intensified drain engineering in high performance digital CMOS technology transistor design. Recent studies have proven that very shallow junction formation (around 0.1 micron or less) is necessary for drain engineering to be feasible in quarter-micron technology devices and below, which is common in current CMOS technology. To illustrate some of the conventional transistor devices and their associated limitations, reference is now drawn to FIGS. 1A through 1E.

Figure 1A:
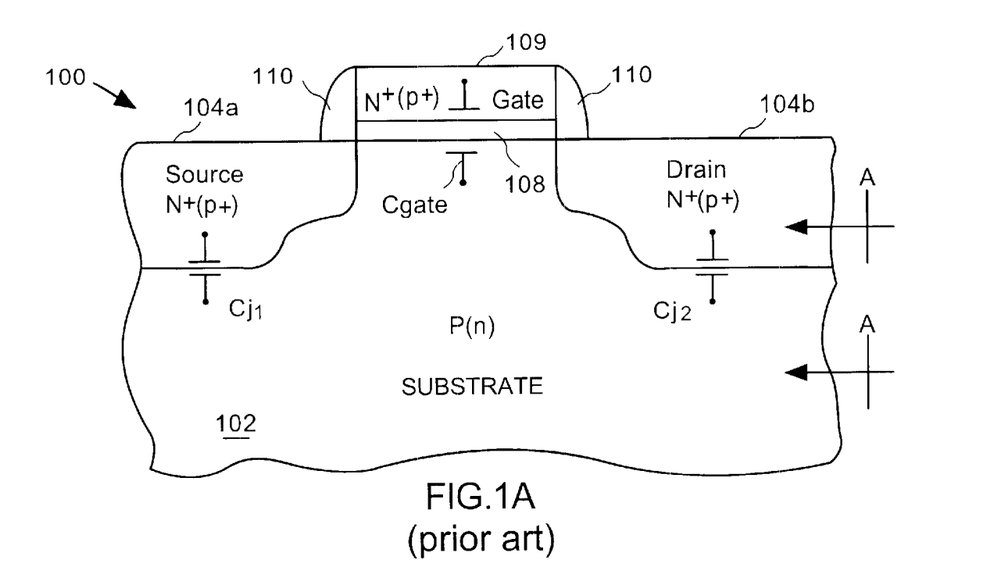
FIG. 1A shows a cross-sectional view of an LDD (lightly doped drain) transistor device fabricated over a semiconductor substrate.

FIG. 1A shows a cross-sectional view of an LDD (lightly doped drain) transistor device 100 fabricated over a semiconductor substrate 102. The LDD transistor device 100 is shown having diffusion regions 104a and 104b, which respectively define the source and drain of the transistor device 100. Between the source and drain, a gate structure including a gate oxide 108 and a gate electrode 109 is fabricated thereon. The transistor device 100 also includes oxide spacers 110, which are used during the formation of the lightly doped drain (LDD) regions. In this example, the substrate is a P-type substrate (but of course, it can be an N-type substrate as illustrated by the parenthesis), and the diffusion regions 104 that define the source and drain are implanted with N+ impurities. In addition, the gate structure 109 is an N+ impurity region. During the normal operation of the LDD transistor device 100, a gate capacitance ($C_{gate}$) is established across the gate oxide 108. A significant component of total capacitance is the parasitic junction capacitance ($C_1$) that is created at the induced depletion region between the source/drain and substrate interface.

As pictorially illustrated, the parasitic capacitance created between the source/drain and the substrate are shown as $C_{J1}$, and $C_{J2}$. Therefore, the total capacitance is approximately equal to "$C_{total}=C_{gate}+C_{J1}+C_{J2}$." Although a gate capacitance $C_{gate}$ is required for the normal operation of the LDD transistor device 100, the presence of the parasitic capacitance $C_{J1}$ and $C_2$ has a detrimental impact upon the speed that the transistor can switch during a logic transition. That is, each time the transistor device switches between a logic state, the source/drain junction parasitic capacitance must be charged and discharged, which can unfortunately slow down the functionality of a high performance circuit.

Figure 1B:
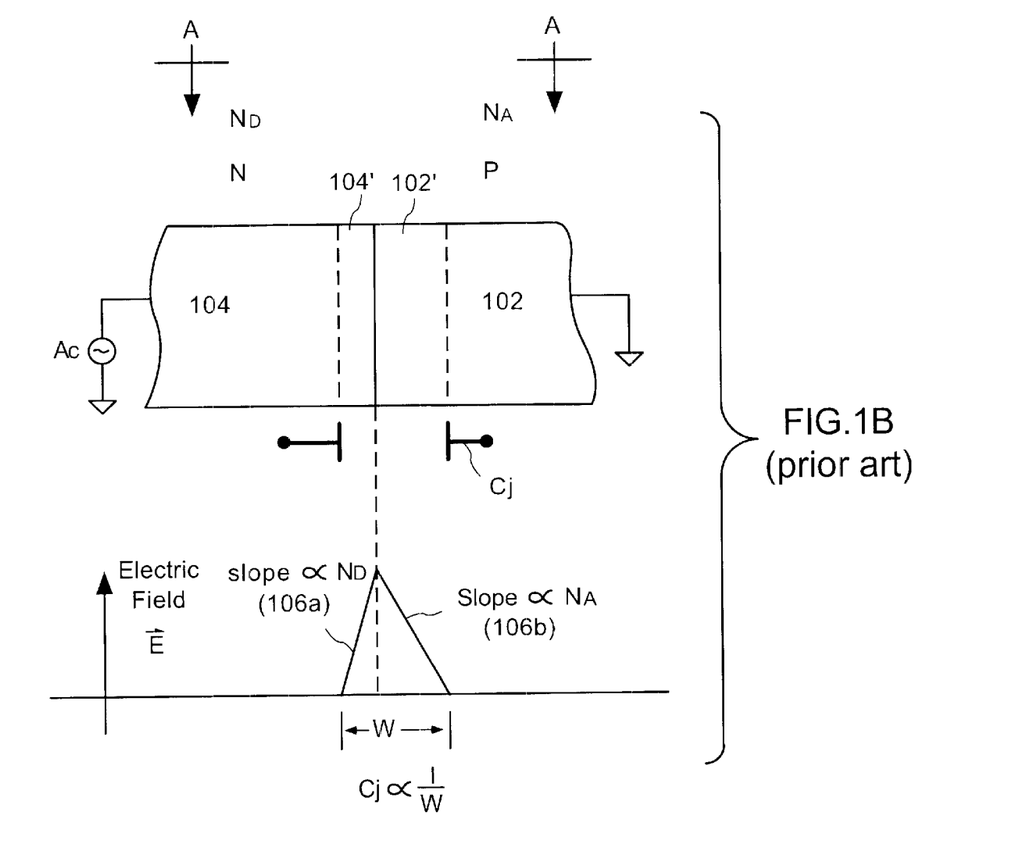
FIG. 1B shows a cross-sectional view of a portion of the transistor device of FIG. 1A to illustrate a source of junction capacitance $C_J$.

For ease of understanding, reference is now drawn to FIG. 1B in which the junction capacitance $C_J$ between the diffusion regions 104 and the substrate 102 are pictorially illustrated about cross-section A—A. When an alternating current (AC) is applied between the junction formed by the diffusion regions 104 and the substrate 102, the depletion region 104'/102' that is at the junction of the two materials responds to the AC signal. More specifically, the electric field (E) is plotted across the junction between the diffusion region 104 and the substrate 102 to illustrate how the parasitic capacitance $C_J$ at the junction is approximated.

The electric field across the junction of the diffusion region 104 is plotted in a line 106a having a slope that is approximately proportional to the concentration of donor atoms ($N_D$) of 104. In a like manner, the line 106b has a slope that is defined by the approximate concentration of acceptor atoms ($N_A$) of the substrate 102. Once the electric field is plotted, the junction capacitance $C_J$ is approximated to be 1/W, where W is the width of the depletion region. Therefore, if the donor concentration ($N_D$) of the diffusion region 104 increases, the slope 106a will also increase. Similarly, if the acceptor atom concentration ($N_A$) of the substrate 102 increases, the slope 106b will also increase. In this example, the slope of line 106a is greater than the slope of line 106b because the donor concentration of the diffusion region 104 is higher than the concentration of the acceptor atoms in the substrate 102.

For the LDD transistor device 100 to operate properly, the concentration in the diffusion regions 104 must be greater than the concentration of the substrate 102. For example, the impurity concentration of P+ and N+ diffusion regions 104 are typically in the range of between about $1\times10^{19}$ atoms $cm^{-3}$ and $1\times10^{21}$ atoms $cm^{-3}$. The impurity concentration of the substrate 102 on the other hand, typically ranges between about $1\times10^{16}$ atoms $cm^{-3}$ and about $5\times10^{17}$ $cm^{-3}$. As a result, it is generally not possible to decrease the large parasitic junction capacitance $C_J$ in an LDD transistor device, which necessarily limits its application in high performance applications (or simply slows down the circuit due to capacitive loading).

As mentioned above, another problem with the continued shrinking of transistor devices is the ability to meet tight backend processing thermal budget requirements. As is well known, a thermal budget is generally determined by calculating the total number of heat treatments and the time of those heat treatments that must be performed during the formation of the various layers of an integrated circuit device. By way of example, when an integrated circuit device requires a set number of layers, a thermal budget places a limitation on the heat treatments, such that dopant impurities do not over-diffuse into the substrate. For example, several types of dielectric deposition techniques require the application of heat annealing operations in order to adequately cure the dielectric materials. Such dielectric materials include spin-on glass (SOG), wherein the quality is improved by performing a certain type of heat anneal treatment. Additional heat treatments are also commonly required to cure certain types of conductive vias. Unfortunately, all of these heat treatments add to an already tight thermal budget.

Figure 1C:
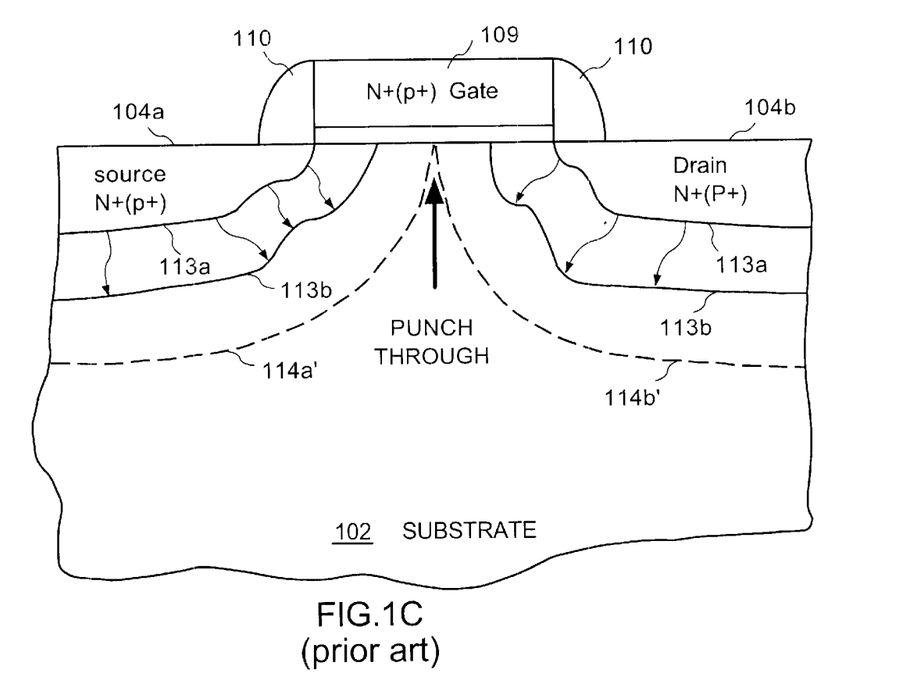
FIG. 1C shows an ideal diffusion profile which must be maintained after all of the backend thermal processing is performed.

FIG. 1C shows an ideal diffusion profile 113a which must be maintained after all of the backend thermal processing is performed. However, when the thermal budget is set too tight, the diffusion regions 104 may subsequently drop into the substrate down to profile lines 113b, thereby causing the depletion regions 114a' and 114b' to be formed. As a result, the source and drain regions will no longer be isolated from one another, and will "punch-through" to electrically connect the source and drain. In other words, when punched-through occurs in a transistor device, the transistor will no longer operate in its intended manner. Unfortunately, the possibility of having the punched-through effect occurring in modern transistor devices is increasing as the demand for smaller and smaller transistor devices continues to grow. As a result, very stringent thermal budget requirements are placed on all backend processing, which therefore increase the complexity and cost of fabrication.

Figure 1D:
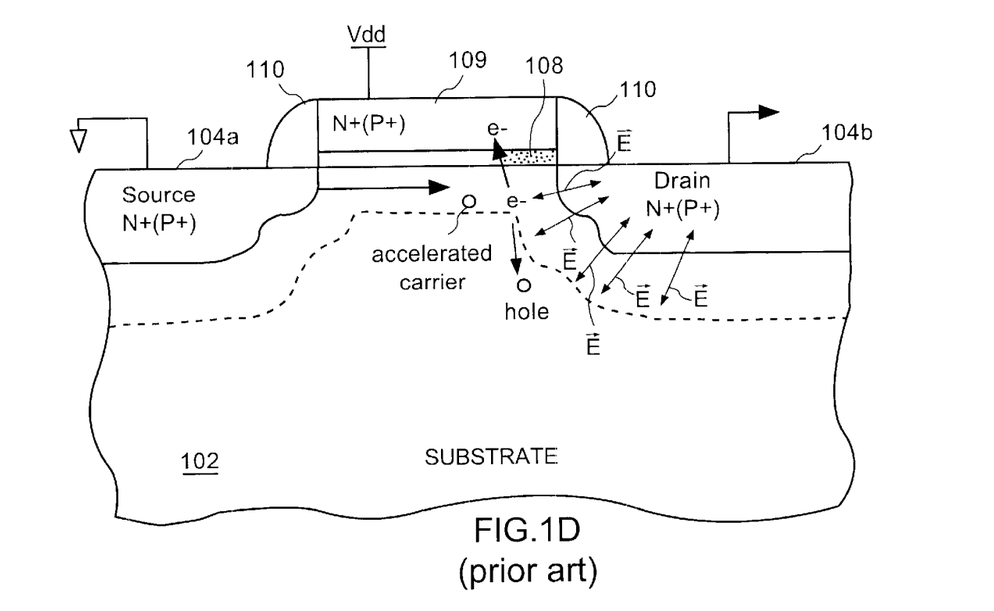
FIG. 1D is a pictorial illustration of the electric field (E) that is created when conduction between the source and drain occurs during an ON state.

FIG. 1D is a pictorial illustration of the electric field (E) that is created when conduction between the source and drain occurs during an ON state. As further mentioned above, another problem with conventional LDD transistor devices is that of hot carrier generation, that arises from impact ionization at the drain junction. For ease of understanding, when a carrier is accelerated by an electric field across the channel length of the transistor device, the carrier is caused to impact onto an atom which thereby causes a release of an electron and a hole. Because the electric field that is generated at the drain and substrate interface is substantially perpendicular to the interface (with a large lateral component), the generated electron will be directed toward the gate electrode 109 and caused to travel through the gate oxide 108. One well known hot electron effect is the degrading damage to the gate oxide 108. Additionally, electrons may become trapped in the gate oxide 108, which causes undesirable variations in threshold voltage. For example, in NMOS transistor devices, the variations in threshold voltage can produce a reduction in drive current. As a result, the transistor device may ultimately fail to deliver the type of required performance.

Figure 1E:
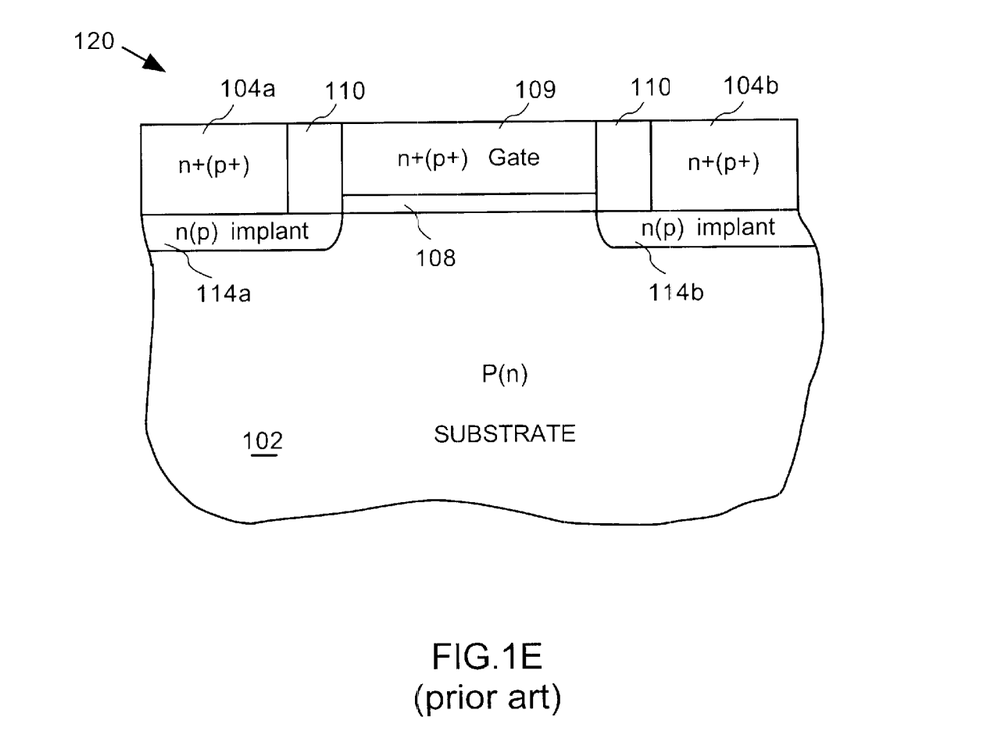
FIG. 1E shows a prior art structure of a raised source/drain transistor device.

FIG. 1E shows a prior art structure of a raised source/drain transistor device 120, which is known to ameliorate some of the hot carrier injection by altering the magnitude and direction of the electric field at the drain/substrate junction. The raised source/drain junctions are typically formed by depositing a crystalline or polycrystalline silicon over the substrate 102. The drain and source regions are therefore formed from diffusion regions 104a and 104b, and optionally, by the inclusion. of implants 114a and 114b. As compared to the LDD structure of FIG. 1A, the oxide sidewalls 110 are formed adjacent to the gate structure 109 and the source/drain deposited regions. Although the raised source/drain transistor structure of FIG. 1E has been successful in somewhat reducing hot carrier injection as described with reference to FIG. 1D, this structure still produces a very large parasitic junction capacitance ($C_J$) between the interface of the substrate 102 and the drain and source regions. In addition, if the thermal budget is not controlled carefully using precision techniques, there is also a possibility for the drain and source implants to further diffuse into the substrate and potentially produce a punched-through structure, such as that of FIG. 1C.

In view of the foregoing, there is a need for a semiconductor transistor structure that produces a low junction capacitance, enables for a more generous thermal budget, and is more resistant to hot carrier injection damage. Further, there is a need for methods of manufacturing new transistor structures which will enable the reduction in junction capacitance, enable a relaxation of thermal budget constraints, and enables a reduction in hot carrier generation.

SUMMARY OF THE INVENTION

Broadly speaking, the present invention fills these needs by providing semiconductor transistor structures that have substantially decreased junction capacitance, relaxed thermal budget parameters, and are more resistant to hot carrier damage. It should be appreciated that the present invention can be implemented in numerous ways, including as a process, an apparatus, a system, a device, a computer readable medium or a method. Several inventive embodiments of the present invention are described below.

In one embodiment, a semiconductor transistor structure that is defined on a substrate is disclosed. The substrate has an active region that is isolated by shallow trench isolation oxide. The semiconductor transistor structure includes a gate stack that is disposed over a gate oxide that is in turn disposed over the active region of the substrate. A pair of shallow trenches are defined on either side of the gate stack. An intrinsic silicon material is disposed within the pair of shallow trenches up to a top surface of the gate stack and the shallow trench isolation oxide. The semiconductor transistor structure further includes source and drain implanted impurities that are defined in an upper portion of the intrinsic silicon material. The upper portion is configured to extend down into the intrinsic silicon material to a target diffusion level that is just below the gate oxide of the gate stack.

In another embodiment, a MOSFET structure is disclosed. The MOSFET structure includes a gate stack that is disposed over a gate oxide that is in turn disposed over an active region of a substrate. A pair of shallow trenches are defined on either side of the gate stack, and an intrinsic silicon material is disposed within the pair of shallow trenches up to a top surface of the gate stack. The MOSFET structure further includes source and drain implanted impurities that are defined in an upper portion of the intrinsic silicon material. The upper portion is configured to extend down into the intrinsic silicon material to a target diffusion level that is just below the gate oxide of the gate stack.

In yet another embodiment, a method for making a MOSFET structure having reduced parasitic junction capacitance is disclosed. The method includes: (a) forming shallow trench isolation regions in a substrate to define an active region; (b) forming a gate stack over the active region; (c) implanting lightly doped drain impurities into the active region on either side of the gate stack; (d) forming oxide sidewalls around the gate stack; (e) forming shallow trenches in the active region on either side of the gate stack, the shallow trenches are configured to remove most of the implanted lightly doped drain impurities except for a portion of impurities that lie under the oxide sidewalls; (f) depositing an intrinsic silicon into the shallow trenches up to at least a topmost level of the gate stack; and (g) implanting source drain impurities over the intrinsic silicon and the gate stack, the implanted impurities being configured to partially diffuse into the intrinsic silicon such that an electrical connection can be made to the portion of impurities of the lightly doped drain impurities that lie under the oxide sidewalls.

As will be further appreciated upon studying the detail description and drawings of the claimed embodiments, the disclosed transistor structure is configured to substantially reduce the parasitic junction capacitance, relax the thermal budget requirements during fabrication of backend operations, and reduce hot carrier damage (due to a reduction in lateral electric field). It should also become apparent that having such a reduced parasitic junction capacitance makes application of the disclosed transistor structure in ESD devices very beneficial (due to a large decrease in capacitive loading). Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention is disclosed for semiconductor transistor structures having decreased junction capacitance, relaxed thermal budget parameters, and improved resistance to hot carrier damage. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
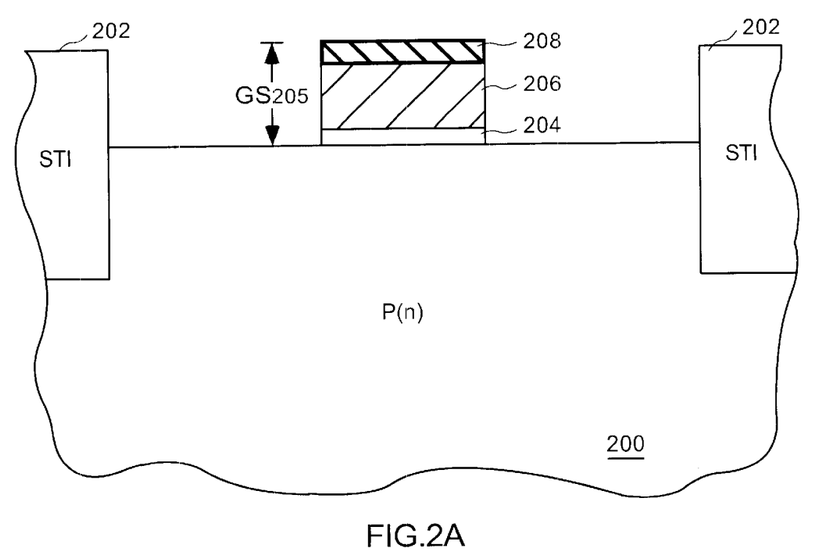
FIG. 2A illustrates a cross-sectional view of a semiconductor substrate having a partially fabricated MOSFET transistor device in accordance with one embodiment of the present invention.

FIG. 2A illustrates a cross-sectional view of a semiconductor substrate 200 having a partially fabricated MOSFET transistor device in accordance with one embodiment of the present invention. As is well known, transistor devices are typically isolated from one another throughout an integrated circuit design using shallow trench isolations(STI) structures 202. The So structures 202 therefore isolate active silicon regions over which transistor structures are ultimately formed. In this example, a gate stack (GS) includes a gate oxide 204, an undoped polysilicon gate electrode 206, and a pad oxide 208 on top of the polysilicon gate 206. Preferably, the gate oxide 204 has a thickness ranging between about 30 angstroms and about 60 angstroms. The polysilicon layer 206 preferably has a thickness ranging between about 1,500 angstroms and about 3,000 angstroms. The pad oxide 208, which is preferably grown, has a thickness that is about 500 angstroms. Accordingly, for this example, the gate stack (GS) has a total thickness 205 that ranges between about 2,000angstroms and about 3,500 angstroms.

Figure 2B:
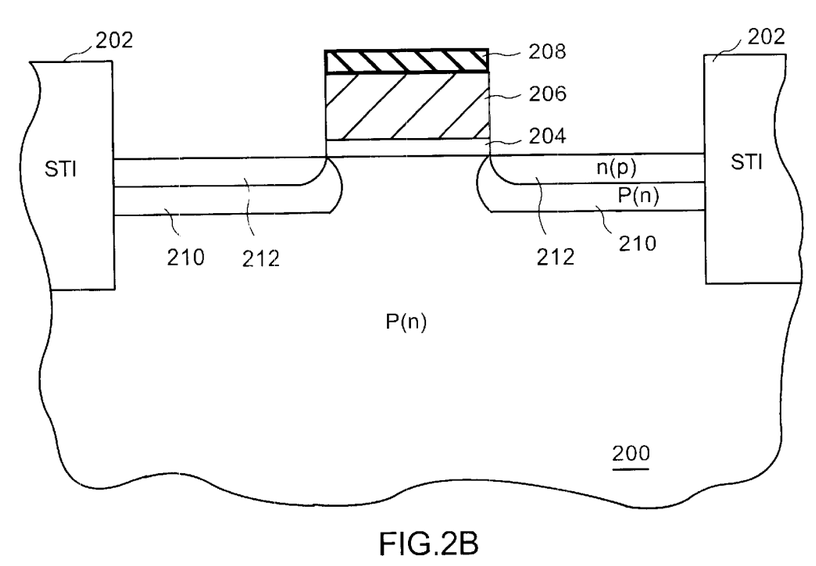
FIG. 2B illustrates the formation of LDD implants and optional pocket implants.

Once the gate stack has been fabricated as shown in FIG. 2A, drain engineering implants are performed to define pocket implants 210 and LDD implants 212 as shown in FIG. 2B. In this example, the pocket implants are doped using an implant energy ranging between about 5 KeV and 20 KeV, to define an impurity concentration ranging between about $1 \times 10^{17}$ atoms $cm^{-3}$ and about $1 \times 10^{18}$ atoms $cm^{-3}$. The LDD implants are preferably formed using an implant energy ranging between about 1 KeV and about 10 KeV, to produce a dopant concentration ranging between about $3 \times 10^{17}$ atoms $cm^{-3}$ and about $3 \times 10^{18}$ atoms $cm^{-3}$.

Figure 2C:
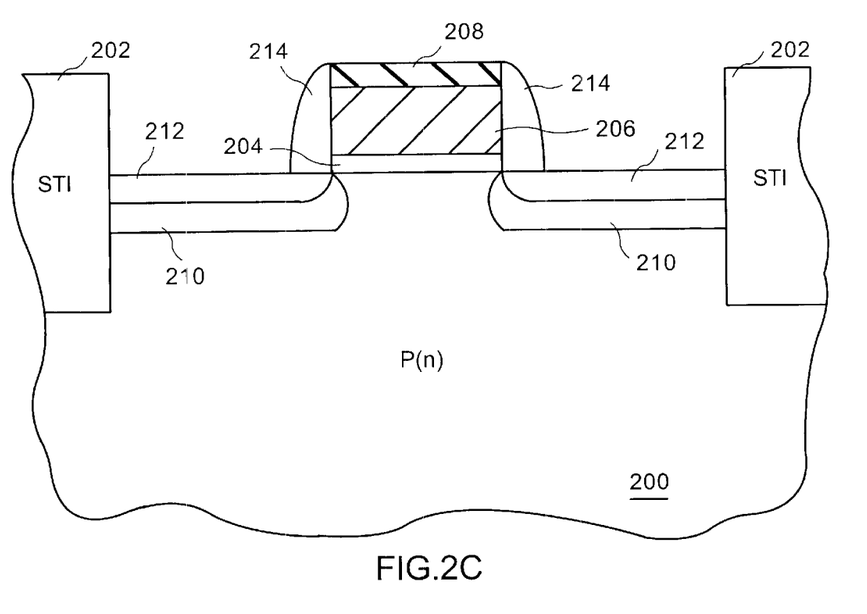
FIG. 2C illustrates the formation of oxide sidewalls.

In this embodiment, the substrate 200 has a background doping concentration ranging between about $5 \times 10^{16}$ atoms $cm^{-3}$ and about $5 \times 10^{17}$ atoms $cm^{-3}$. The pocket implants 210 are preferably well suited to further reduce the lateral component of the electric field that is closest to and is approximately parallel to the gate oxide in the channel region (e.g., between the substrate 200 and the diffusion regions). In this manner, generated hot electrons will be diverted away from the gate oxide 204, thereby producing a more reliable transistor device. Once the LDD implants 212 and the pocket implants 210 have been formed, conventional sidewall oxide formation is performed to produce sidewalls 214 around the gate stack (GS) as shown in FIG. 2C.

Figure 2D:
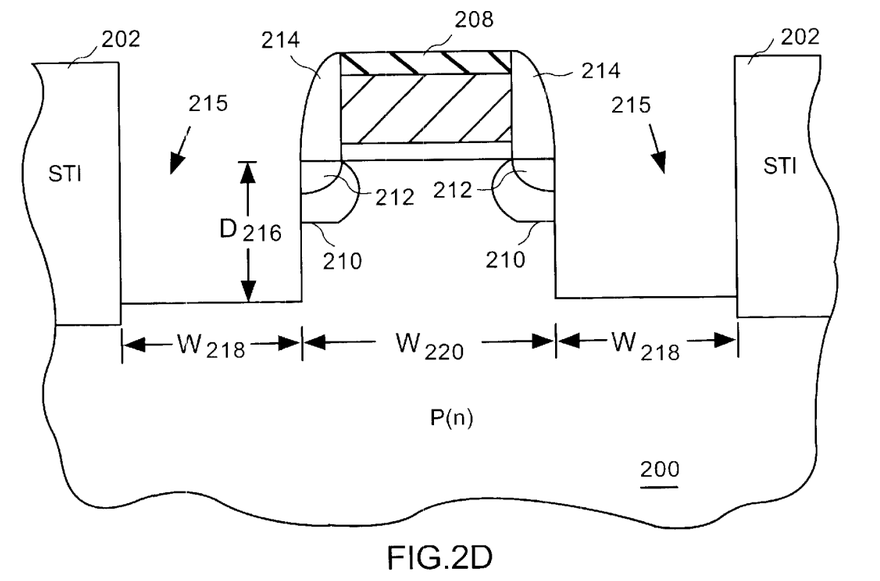
FIG. 2D illustrates the result of a shallow trench etch operation between the gate stack of the transistor structure.

At this stage, instead of performing conventional drain/source implants, a junction mask is used to etch shallow trenches 215 having a depth of between about 1,000 angstroms and about 6,000 angstroms, and more preferably between about 2,000angstroms and about 4,000 angstroms, and most preferably about 3,000 angstroms, as shown by an etch distance $D_{216}$ in FIG. 2D. In this embodiment, the shallow trenches 215 will preferably have a width $W_{218}$ that ranges between about 7,000 angstroms and about 14,000 angstroms.

Accordingly, the width between the shallow trenches 215 is defined by $W_{220}$, which ranges between about 2,500 angstroms and about 4,500 angstroms. It should be understood that these exemplary dimensions are preferable for 0.25 micron technology integrated circuits devices and below. However, the details of the examples herein may be modified depending on the minimum length dimension being implemented for the particular integrated circuit technology.

Figure 2E:
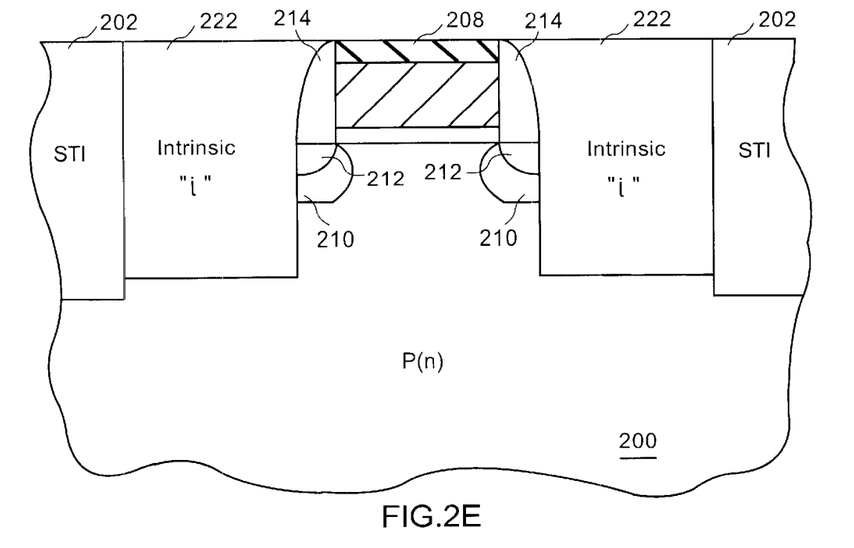
FIG. 2E illustrates the cross-sectional view of the semiconductor device after a deposition of "undoped" silicon is performed.

FIG. 2E illustrates the cross-sectional view of the semiconductor device after a deposition of "undoped" silicon is performed. The undoped silicon is preferably an intrinsic "i" silicon material having an approximate impurity concentration that is about less than or equal to $1\times10^{14}$ atoms $cm^{-3}$. It should be noted that the intrinsic silicon has an impurity level that is substantially lower than that of the bulk silicon of the substrate 200, which ranges between about $1\times10^{16}$ atoms $cm^{-3}$ and about $5\times10^{17}$ atoms $cm^{-3}$. In one embodiment, the deposition of the undoped silicon may be performed by selective epitaxy deposition or by non-selective deposition of crystalline or polycrystalline silicon. However, single crystal silicon is preferred because it allows for better control in the diffusion of impurities.

Once the undoped silicon has been deposited, a chemical mechanical polishing (CMP) operation is performed in order to planarize the surface of the wafer until the planarization reaches the surface of the shallow trench isolation (STI) 202 regions and the pad oxide 208, that overlies the polysilicon layer 206. Accordingly, the pad oxide 208 will assist in providing good end-point detection during the CMP process. Once the CMP process is complete, the shallow trenches 215 of FIG. 2D will be completely filled with the intrinsic "i" silicon 222.

Figure 2F:
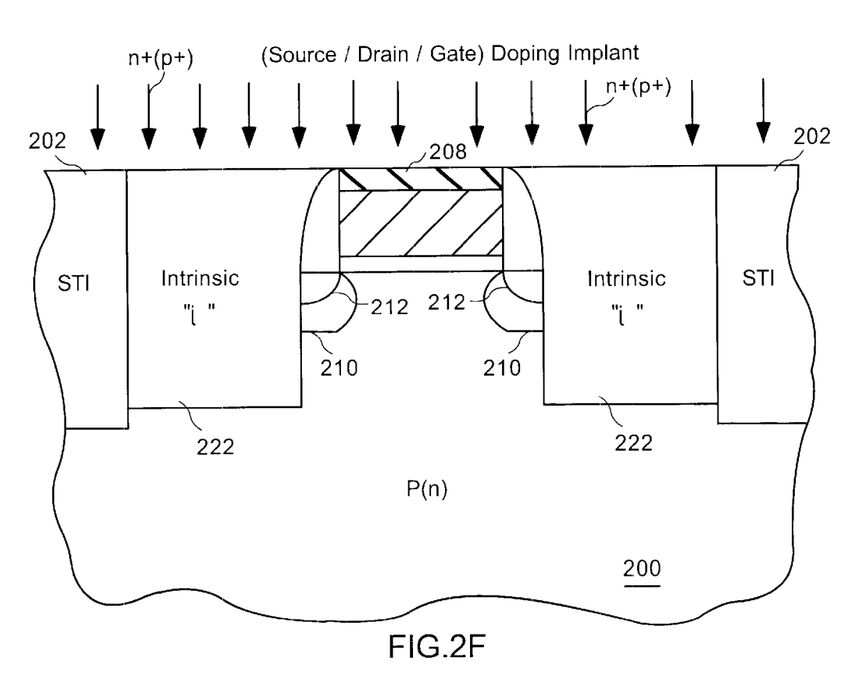
FIG. 2F illustrates the drain/source/gate impurity implant operation.

FIG. 2F illustrates a doping implant operation that is used to dope the source/drain/gate regions of the semiconductor transistor device. In this embodiment, the doping implant is preferably an N+dopant having a concentration that is between about $1\times10^{18}$ atoms $cm^{-3}$ and about $1\times10^{21}$ atoms $cm^{-3}$. Accordingly, the source/drain implant is performed without a mask, except for those regions where the MOSFETs are of the opposite polarity. The pad oxide 208, in this embodiment, will ensure that the peak of the implant goes deeper into the source/drain regions than in the gate region.

Figure 3A:
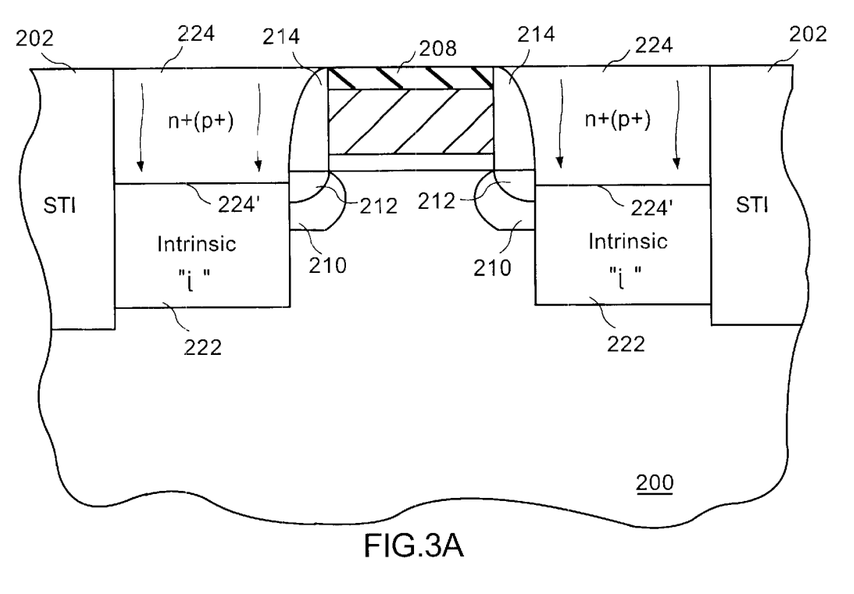
FIG. 3A illustrates a cross-sectional view of a transistor structure in accordance with one embodiment of the present invention.
Figure 3B:
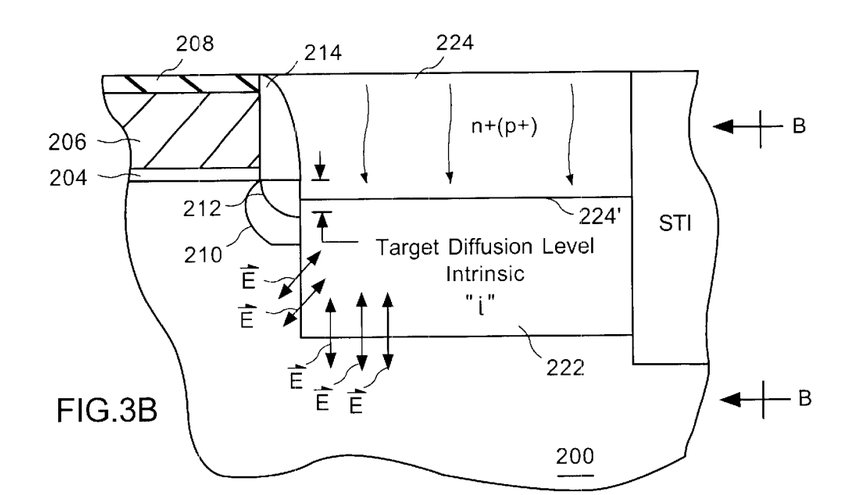
FIG. 3B illustrates a more detailed view of a source/drain region and an intrinsic silicon region of the transistor structure in accordance with one embodiment of the present invention.

After all of thermal processing during front-end and backend fabrication, the dopant will penetrate slightly deeper in the source/drain regions than in the gate region, thus making a low resistance path with the previously implanted LDD implant region 212 as shown in FIG. 3A. Specifically, the newly-formed source/drain regions 224 are preferably caused to diffuse to a target diffusion level 224' that is illustrated in FIG. 3B. In this manner, a clear path exists between the diffusion source/drain region 224 and the LDD region 212.

The resulting transistor structure of FIG. 3A therefore achieves a near-zero junction depth (i.e., the diffusion regions 224 only partially fall below the original substrate surface level that is at the interface of the gate oxide 204), as in the raised source/drain MOSFET structures of FIG. 1E, while at the same time, the thermal budget constraints are considerably eased. That is, once the implant operation is performed as discussed with reference to FIG. 2F, the impurities will be allowed to diffuse down to the target level 224' during all of the subsequent thermal processing operations, with less danger of having the diffusion regions punch-through (as described with reference to FIG. 1C).

In addition, because the MOSFET structure of the present invention incorporates some of the benefits of a conventional raised source/drain structure, hot carrier generation is also ameliorated by altering the majority of the electric field away from the channel (i.e., reducing the lateral component) and in a profile that is in the vertical direction. This is counter to the prior art, which has a greater majority of the electric field in the lateral direction (as shown in FIG. 1D). By reducing the electric field in the lateral direction, fewer generated hot carrier electrons will be directed through the gate oxide 204, and therefore, a substantial reduction in gate oxide damage and transistor performance deteriorating damage will occur.

One concern with elevated source/drain MOSFETs is, however, the parasitic capacitance between the source/drain and gate because of the sidewall oxide 214. However, upon investigation, it was discovered that for modest sidewall oxide 214 thicknesses (e.g., about 0.1 micron), the parasitic capacitance is about the same as fringing capacitance in conventional MOSFETs having gate oxide thicknesses of about 50 angstroms or lower. Accordingly, the sidewall capacitance effectively replaces the fringing capacitance.

Figure 3C:
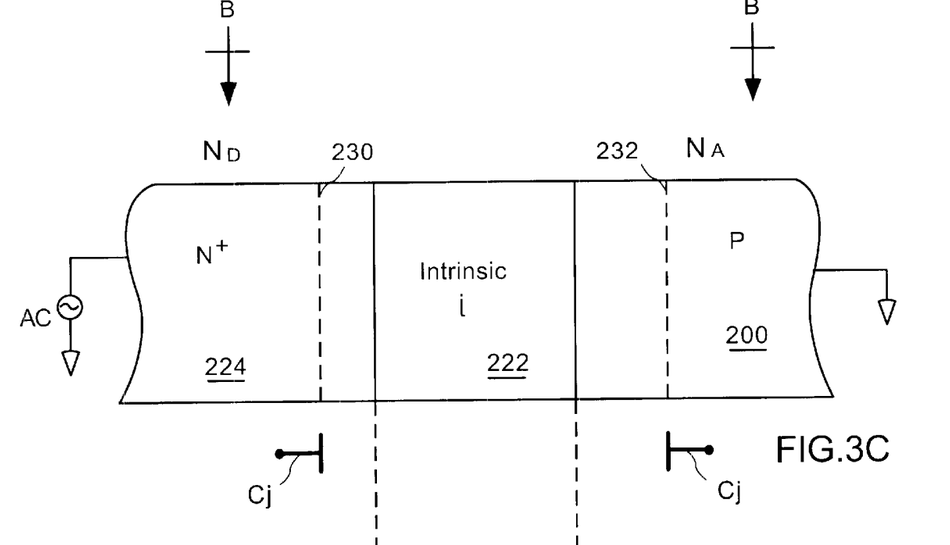
FIG. 3C illustrates a cross-section B—B as shown in FIG. 3B in accordance with one embodiment of the present invention.
Figure 3D:
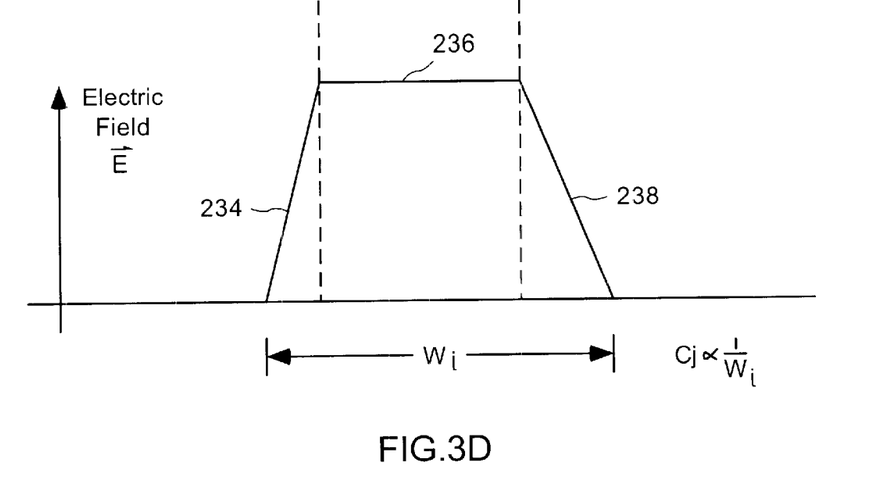
FIG. 3D illustrates a plot of electric field across the cross-section B—B of FIG. 3B.

FIG. 3C illustrates a cross-section B—B as shown in FIG. 3B in accordance with one embodiment of the present invention. When an AC current is passed across the structure of FIG. 3C, a depletion region 230 is induced in the diffusion region 224, and a depletion region 232 is induced in the substrate 200 between the intrinsic silicon 222. In this example, the produced electric field across the diffusion region 224, the intrinsic region 222, and the substrate 200 will be as illustrated in FIG. 3D. As mentioned above, a slope 234 is approximately proportional to the donor concentration ($N_D$) of the diffusion region 224, while the slope 238 is approximately proportional to the acceptor concentration ($N_A$) of the substrate 200.

However, because the intrinsic silicon 222 has a very low impurity concentration that is less than or equal to about $1\times10^{13}$ atoms $cm^{-3}$ (sometimes slightly greater up to about $10^{14}$ atoms $cm^{-3}$), the slope is approximately horizontal as shown by line 236. As a result, the width between an ideal capacitor that is defined between the depletion regions 230 and 232 in FIG. 3C, will define the junction capacitance $C_J$. The junction capacitance $C_J$ is approximately proportional to $1/W_i$, where $W_i$ is the distance between the depletion regions 230 and 232 as shown in FIG. 3D. Therefore, by having the intrinsic silicon 222 as part of the MOSFET structure, a substantially reduced parasitic capacitance for the junction capacitance $C_J$ is produced, which therefore has the beneficial effect of increasing the switching speed of the transistor device. By theoretical calculations, it was proven that the parasitic junction capacitance $C_J$ can be reduced by a factor of two to three times that of conventional MOSFET transistor structures.

Figure 4A:
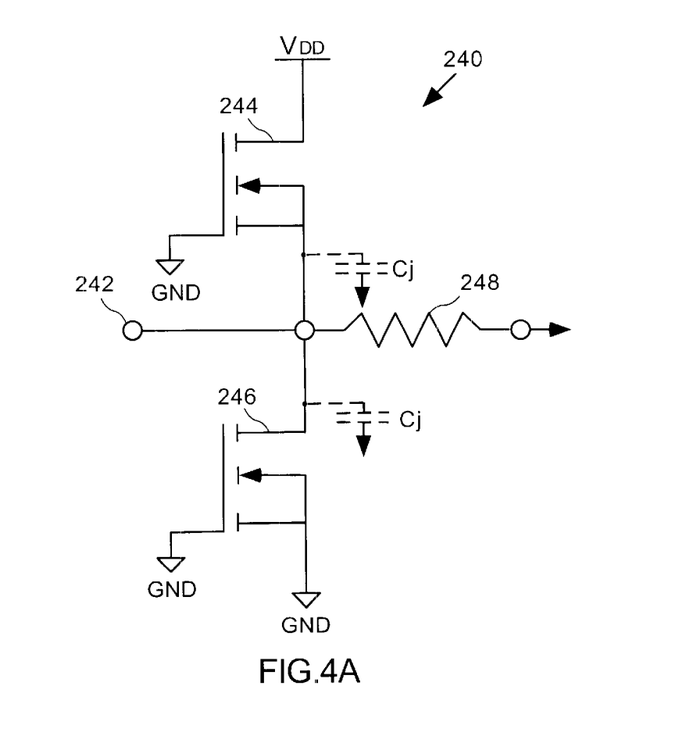
FIG. 4A illustrates the transistor structure of the present invention being integrated into an I/O circuit, such as an input ESD device.

Because the transistor structure of FIG. 3A is well suited to substantially lower the junction capacitance by a factor of two to three times that of conventional MOSFETs, the new MOSFET structure of FIG. 3A is particularly well suited for use in electrostatic discharge (ESD) protection devices. For example, in ESD protection structures, the MOSFETs are configured to have a grounded gate configuration as shown by the MOSFET transistors 244 and 246 of FIG. 4A, which depicts a common I/O "input" circuit 240. Because the total capacitance of the input circuit 240 is dominated by the junction capacitance $C_J$, by implementing the reduced junction capacitance transistor structure of FIG. 3A for the transistors 244 and 246, the input circuit 240 will be faster due to the substantial reduction in capacitive loading.

Figure 4B:
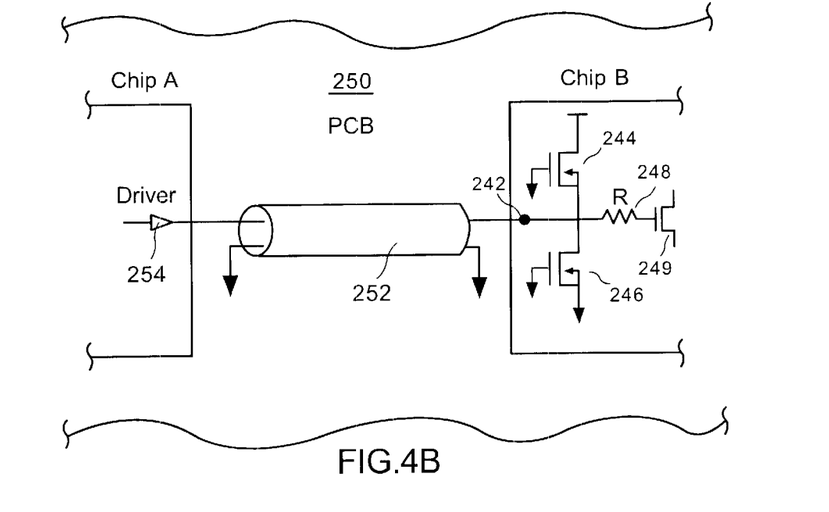
FIG. 4B illustrates an example of a signal being driven between a CHIP-A and a CHIP-B that are integrated onto a printed circuit board (PCB) in accordance with one embodiment of the present invention.

FIG. 4B illustrates an example of a signal being driven between a CHIP-A and a CHIP-B that are integrated onto a printed circuit board (PCB) 250. When a signal is driven out from CHIP-A by a driver 254, the signal is driven across a transmission line 252 that is integrated on the PCB 250 until the signal is passed to node 242, which is driven through a resistor 248. Because the junction capacitance $C_J$ of the transistors 244 and 246 are substantially reduced, the signal may be more rapidly passed to core circuitry, such as a transistor device 249 which may be integrated as part of the core circuitry of the integrated circuit of CHIP-B. Of course, the reduced parasitic junction capacitance features of this new MOSFET device can be taken advantage of in any integrated circuit application desiring less capacitive loading.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making a MOSFET structure having reduced parasitic junction capacitance, comprising:

forming shallow trench isolation regions in a substrate to define an active region;

forming a gate stack over the active region;

implanting lightly doped drain impurities into the active region on either side of the gate stack;

forming oxide sidewalls around the gate stack;

forming shallow trenches in the active region on either side of the gate stack, the shallow trenches are configured to remove most of the implanted lightly doped drain impurities except for a portion of impurities that lie under the oxide sidewalls;

depositing an intrinsic silicon into the shallow trenches up to at least a topmost level of the gate stack; and implanting source drain impurities over the intrinsic silicon and the gate stack, the implanted impurities being configured to partially diffuse into the intrinsic silicon such that an electrical connection can be made to the portion of impurities of the lightly doped drain impurities that lie under the oxide sidewalls.

2. A method for making a MOSFET structure as recited in claim 1, further comprising:

performing a chemical mechanical polishing operation after the depositing of the intrinsic silicon and before the implanting of the source drain impurities.

3. A method for making a MOSFET structure as recited in claim 1, wherein forming shallow trenches in the active region comprises:

etching between about 1,000 angstroms and about 6,000 angstroms of the substrate.

4. A method for making a MOSFET structure as recited in claim 1, wherein the forming of the gate stack over the active region includes:

forming a gate oxide;

forming a polysilicon gate;

forming a pad oxide over the polysilicon gate.

5. A method for making a MOSFET structure as recited in claim 1, wherein the parasitic junction capacitance is reduced due to the intrinsic silicon material that has a very low impurity concentration level.

6. A method for making a MOSFET structure as recited in claim 5, wherein the very low impurity concentration level is less than or equal to about $1\times10^{14}$ atoms/cm$^{-3}$.

7. A method for making a MOSFET structure as recited in claim 1, wherein the intrinsic silicon material assists in reducing a lateral electric field which therefore assists in reducing hot carrier damage.

8. A method for making a MOSFET structure as recited in claim 1, wherein the implanting of the source drain impurities over the intrinsic silicon reduces punch-through and relaxes the thermal budget constrains.

9. A method for making a MOSFET structure as recited in claim 1, wherein the depositing of the intrinsic silicon is performed by one of a selective epitaxy deposition, a non-selective deposition of crystalline, and a non-selective deposition of polycrystalline silicon.

10. A method for making a MOSFET structure having reduced parasitic junction capacitance, comprising:

forming a gate stack over an active region of a substrate;

implanting lightly doped drain impurities into the active region on either side of the gate stack;

forming oxide sidewalls around the gate stack;

forming shallow trenches in the active region on either side of the gate stack, the shallow trenches are configured to remove most of the implanted lightly doped drain impurities except for a portion of impurities that lie under the oxide sidewalls;

depositing an intrinsic silicon into the shallow trenches up to at least a topmost level of the gate stack; and implanting source drain impurities over the intrinsic silicon and the gate stack, the implanted impurities being configured to partially diffuse into the intrinsic silicon such that an electrical connection can be made to the portion of impurities of the lightly doped drain impurities that lie under the oxide sidewalls.

11. A method for making a MOSFET structure having reduced parasitic junction capacitance, comprising:

forming a gate over an active region of a substrate;

implanting lightly doped drain impurities into the active region on either side of the gate;

forming oxide sidewalls around the gate;

forming shallow trenches in the active region on either side of the gate, the shallow trenches are configured to remove most of the implanted lightly doped drain impurities except for a portion of impurities that lie under the oxide sidewalls;

depositing an intrinsic silicon into the shallow trenches up to at least a topmost level of the gate; and implanting source drain impurities over the intrinsic silicon and the gate, the implanted impurities being configured to partially diffuse into the intrinsic silicon such that an electrical connection can be made to the portion of impurities of the lightly doped drain impurities that lie under the oxide sidewalls, the implanting of the source drain impurities over the intrinsic silicon being configured to reduce punch-through.

* * * * *